United States Patent [19]
Smithgall

[11] Patent Number: 6,027,027
[45] Date of Patent: Feb. 22, 2000

[54] LUGGAGE TAG ASSEMBLY

[75] Inventor: David Harry Smithgall, East Windsor, N.J.

[73] Assignee: Lucent Technologies Inc., Murray Hill, N.J.

[21] Appl. No.: 08/866,936

[22] Filed: May 31, 1997

Related U.S. Application Data

[60] Provisional application No. 60/018,720, May 31, 1996.

[51] Int. Cl.$^7$ .................................................. G06K 19/02
[52] U.S. Cl. ........................................... 235/488; 235/487
[58] Field of Search .................................... 235/488, 382, 235/492, 486, 375, 380, 382.5

[56] References Cited

U.S. PATENT DOCUMENTS

| | | | |
|---|---|---|---|
| 5,019,700 | 5/1991 | Tada et al. | 235/492 |
| 5,272,596 | 12/1993 | Honore et al. | 361/633 |
| 5,399,847 | 3/1995 | Droz | 235/488 |
| 5,438,750 | 8/1995 | Venambre | 235/488 |
| 5,585,618 | 12/1996 | Droz | 235/492 |
| 5,740,606 | 4/1998 | Rose | 235/492 |
| 5,822,190 | 10/1998 | Iwasaki | 361/737 |

*Primary Examiner*—Thien Minh Le
*Attorney, Agent, or Firm*—Samuel R. Williamson

[57] ABSTRACT

A low cost radio frequency identification tag is provided for attaching to and identifying objects such as, for example, a passenger's luggage. The tag is programmed to contain information such as the origin, destination, and name of a passenger accompanying the luggage. This information is programmed into the tag at the time when the customer checks his or her luggage at a terminal. The tag includes an integrated circuit with all radio and data functions incorporated onto this integrated circuit, and an antenna for radio communication. The integrated circuit in the tag is suitably powered from the incident radio frequency energy provided by a interrogator while the tag is located in the radiation pattern of this interrogator. The luggage tag is assembled inexpensively by packaging the integrated circuit between paper or plastic substrates on which printed identifying information is also added at the point of check-in at the terminal. Also, a wire loop antenna may be placed between the substrates such that it contacts the integrated circuit at two points, for forming a complete electrical circuit.

14 Claims, 4 Drawing Sheets

ASSEMBLY OF CIRCUIT ONTO SUBSTRATE MATERIAL

LUGGAGE TAG ASSEMBLY

RELATED APPLICATIONS

This application claims the benefit of Provisional application Ser. No. 60/018,720 filed on May 31, 1996 and entitled "Method Of Packaging A Radio Frequency Identification Tag". Also, related subject matter is disclosed in the following applications assigned to the same Assignee hereof: U.S. patent application Ser. No. 08/775,694, entitled "QPSK Modulated Backscatter System", and U.S. patent application Ser. No. 08/492,173, entitled "Dual Mode Modulated Backscatter System."

FIELD OF THE INVENTION

This invention relates to wireless communication systems and, more particularly, to a method for assembling a wireless radio frequency identification tag for use in an RFID communications system.

BACKGROUND OF THE INVENTION

Radio Frequency identification (RFID) systems are used for identification and/or tracking of equipment or inventory such as pallets, trucks, dollies or boxes or even the whereabouts of some animals, such as livestock in certain situations. These RFID systems are radio communication systems in which communications is provided between a radio transceiver, or interrogator, and a number of small, identifying labels or tags. These tags are read while in the radiation pattern or field of the interrogator, which may be connected to a computer-based tracking system. The intent of an RFID system is to provide a reliable and secure architecture that meets a predetermined performance requirement, while minimizing the cost of the interrogator and the tags. In the operation of RFID systems, the interrogator transmits to the tags using modulated radio signals, and the tags respond by transmitting modulated radio signals back to the interrogator. Specifically, the interrogator first transmits an amplitude modulated signal to the tag. Next, the interrogator transmits a continuous-wave (CW) radio signal to the tag. The tag then modulates the CW signal using modulated back scattering (MBS) wherein the antenna is electrically switched, by the tag's modulating signal, from being an absorber of radio frequency (RF) radiation to being a reflector of RF radiation; thereby encoding the tag's information onto the CW radio signal. The interrogator demodulates the incoming modulated radio signal and decodes the tag's information message.

Radio frequency identification tags may be used in many applications where messages must be exchanged between the interrogator and the tags. Some applications may employ tags in which the tags are needed for only for a short period of time. These tags may be simple and need to contain only a small amount of information. An example of where such a tag would have application is as a luggage tag that is used in both airline and rail transportation, where a trip is usually completed in less than 48 hours. The use of radio frequency identification tags for this application would increase the efficiency of the check in and passenger-luggage reconciliation process for the airline and the passengers. Such tags, however, must be reliable and secure, yet inexpensive.

SUMMARY OF THE INVENTION

In accordance with the invention, a low cost radio frequency identification tag is provided for attaching to and identifying objects such as, for example, a passenger's luggage. The tag is programmed to contain information such as the origin, destination, and name of a passenger accompanying the luggage. This information is programmed into the tag at the time when the customer checks his or her luggage at a terminal. The tag includes an integrated circuit with all radio and data functions incorporated onto this integrated circuit, and an antenna for radio communication. The integrated circuit in the tag is suitably powered from the incident radio frequency energy provided by a interrogator while the tag is located in the radiation pattern of this interrogator. The luggage tag is assembled inexpensively by packaging the integrated circuit between paper or plastic substrates on which printed identifying information is also added at the point of check-in at the terminal. Also, a wire loop antenna may be placed between the substrates such that it contacts the integrated circuit at two points, for forming a complete electrical circuit.

BRIEF DESCRIPTION OF THE DRAWINGS

The invention and its mode of operation will be more clearly understood from the following detailed description when read with the appended drawing in which.

Figure 1:
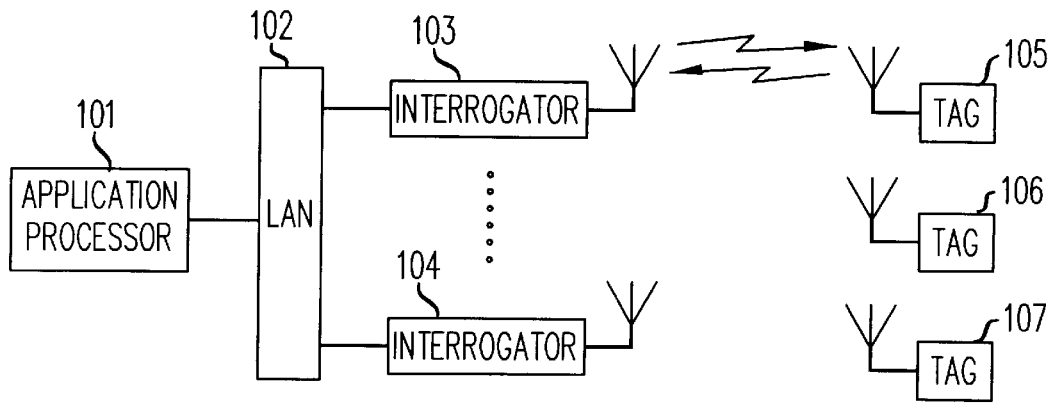
FIG. 1 is shows a block diagram of an illustrative radio frequency identification system.

Throughout the drawing, the same element when shown in more than one figure is designated by the same reference

DETAILED DESCRIPTION

Referring now to FIG. 1, there is shown an overall block diagram of an illustrative radio frequency identification (RFID) system useful for describing the application of the present invention. An application processor 101 provided the function of a computer-based tracking system and communicates over a local area network (LAN) 102 to a plurality of interrogators 103–104. Each of the interrogators may communicate with one or more of read/write tags 105–107. For example, the interrogator 103 may receive an information signal, typically from an application processor 101, for one of the tags 105–107. The interrogator 103 takes this information signal and processor 200, shown in FIG. 2, properly formats a downlink message (information signal 200a) to be sent to the designated tag.

One class of RFID applications involves using RFID technology to read information from a tag affixed to a container or pallet. Such an application is set forth in IATA Recommended Practice RP 1640, International Air Transport Association Cargo Services Conference Resolutions Manual, 16th Edition, Oct. 1, 1993. In this application, the container is moved across the reading field of an interrogator, which is that volume of space wherein successful communications between the tag and the interrogator can take place. While the tag is in the reading field, the interrogator and tag must complete their information exchange before the tag moves out of the interrogation field. Since the tag often may be moving quickly through the reading field, the RFID system may have only a limited amount of time to successfully complete the transaction. In accordance with the invention, a communication protocol advantageously controls communication between the interrogator and one or more tags for effectively reading of these tags.

Figure 2:
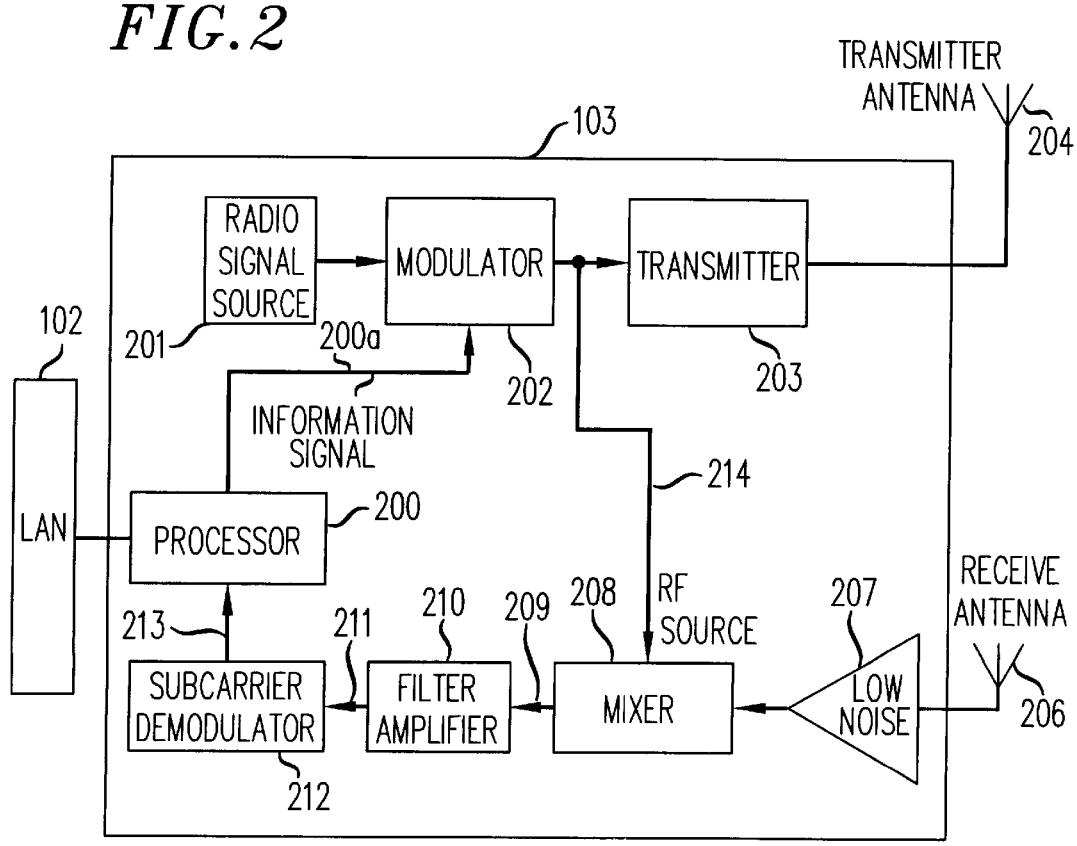
FIG. 2 is a block diagram of an illustrative interrogator unit used in the radio frequency identification system of FIG. 1.

FIG. 2 is a block diagram of an illustrative interrogator unit used in the radio frequency identification system of FIG. 1. With joint reference next to both FIGS. 1 and 2, a radio signal source 201 generates a radio signal, the modulator 202 modulates a information signal 200a onto the radio signal, and a transmitter 203 sends this modulated signal via an antenna 204, illustratively using amplitude modulation, to a tag. Amplitude modulation is a common choice since a tag can demodulate such a signal with a single, inexpensive nonlinear device (such as a diode).

Figure 3:
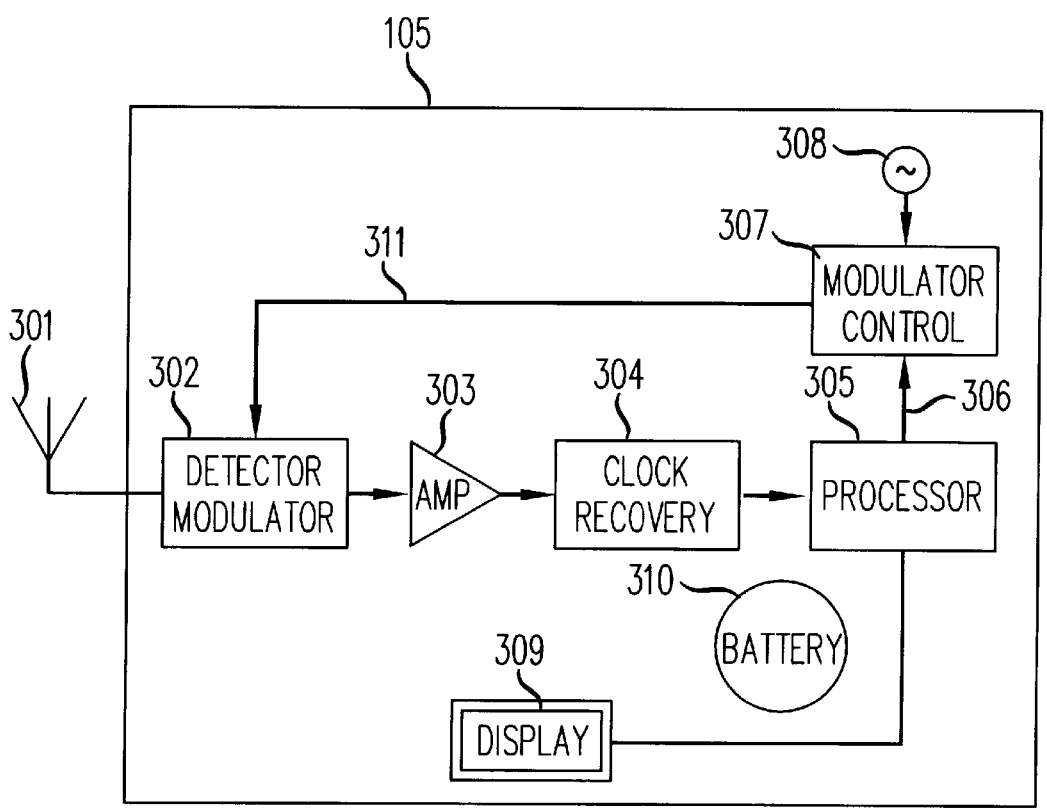
FIG. 3 shows a block diagram of a tag unit suitable for use in the radio frequency identification system of FIG. 1, in accordance with the invention.

FIG. 3 shows a block diagram of a tag unit usable in the radio frequency identification system of FIG. 1, in accordance with the disclosed embodiment of the invention. Although tag 105 is illustratively shown, the circuitry described therein is also present in tags 106 and 107. In the tag 105, the loop antenna 301 receives a modulated signal from one of the plurality of interrogators 103 or 104. This modulated signal is demodulated, directly to baseband, using a detector/modulator 302, which, illustratively, could be a single Schottky diode. The diode is appropriately biased with a proper current level in order to match the impedance of the diode and the antenna 301 so that losses of the radio signal are minimized. After the incoming signal is demodulated directly to baseband by the detector/modulator 302, the information signal is then amplified, by amplifier 303, and synchronization recovered in a clock and frame recovery circuit 304. The resulting information is sent to a processor 305.

The processor 305 generates an information signal 306 to be sent from the tag 105 back to the interrogator (e.g., 103). This information signal 306 (under control of the clock and frame recovery circuit 304) is sent to a modulator control circuit 307, which uses the information signal 306 to modulate a subcarrier frequency generated by the subcarrier frequency source 308. The modulated subcarrier signal 311 is used by detector/modulator 302 to modulate the radio carrier signal received from tag 105 to produce a modulated backscatter (e.g., reflected) signal. This is accomplished by switching on and off the Schottky diode using the modulated subcarrier signal 311, thereby changing the reflectance of antenna 301. Obtaining operating power for the tag 105 just from the incident RF energy is sufficient for most applications of the tag. As an option, operating power may also be obtained from an inexpensive power cell embedded in the tag in the manner disclosed in Provisional application Ser. No. 60/018,635 filled on May 31, 1996 and assigned to the same assignee herewith.

The functions of the components in the tag 105 shown in FIG. 3 may advantageously be implemented in a single ASIC (Application Specific Integrated Circuit) which can be obtained from a number of suppliers such as, for example, Micron Technologies, RCA and Texas Instruments. A Schottky diode rectifier demodulates the received signal to baseband. Additional diodes and capacitors integrated into the ASIC substrate rectify the received RF energy to provide a DC voltage to energize the baseband processing circuit. A nonvolatile memory stores data which can be read from the tag as it passes through the field of the interrogator.

The communication link of the RFID system is based upon the principle of modulated back scatter (MBS). There are a variety of techniques for using MBS to send information from the tag to the interrogator. In some MBS technologies, the modulator control circuit 307 of the tag 105, shown in FIG. 3, for example, generates an amplitude modulated signal modulated at an Information Signal 306 frequency $f_2$. If the radio signal source 201, shown in FIG. 2, generates a CW frequency $f_c$, then the interrogator receives signals at $f_c$, whose bandwidth is $2f_2$ and filters signals outside of this bandwidth range. This approach could be termed the "MBS at baseband" approach. Another approach would be for the tag 105 to generate a subcarrier frequency $f_s$ generated by frequency source 308, as shown in FIG. 3. The information could be conveyed using AM, FSK or Phase Shift Keying (PSK) by modulating the subcarrier frequency $f_s$ of frequency source 308 with the Information Signal $f_2$ from the processor 306. The interrogator 103 receives signals at $f_c$, whose bandwidth is $2f_2$ but at a frequency $f_s$ away from $f_c$. This method is termed "MBS of a subcarrier". In Binary PSK (BPSK) systems, the phase of the subcarrier transitions nominally between 0 and 180 degrees.

Returning once again to FIG. 2, the interrogator 103 receives the reflected and modulated signal with the receive antenna 206, amplifies the signal with a low noise amplifier 207, and demodulates the signal using homodyne detection in a mixer 208 down to the intermediate frequency (IF) of the single subcarrier $f_s$. In some interrogator designs, a single transmitter 204 and receive 206 antenna is used. In this event, an electronic method of separating the transmitted signal from that received by the receiver chain is needed. This could be accomplished by a device such as a circulator. Using the same radio signal source 201 as used in the transmit chain means the demodulation to IF is done using homodyne detection. This has advantages in that it greatly reduces phase noise in the receiver circuits. The mixer 208 sends a demodulated signal 209—if using a quadrature mixer, it sends both I (in phase) and Q (quadrature) signals—into filter/amplifier 210 to properly filter the demodulated signal 209. The resulting filtered signal—then typically an information signal 211 carried on an IF subcarrier—is demodulated from the subcarrier in the subcarrier demodulator 212, which sends the information signal 213 to processor 200 to determine the content of the message. The I and Q channels of Signal 209 can be combined in the filter/amplifier 210, or in the subcarrier demodulator 212, or they could be combined in the processor 200.

Figure 4:
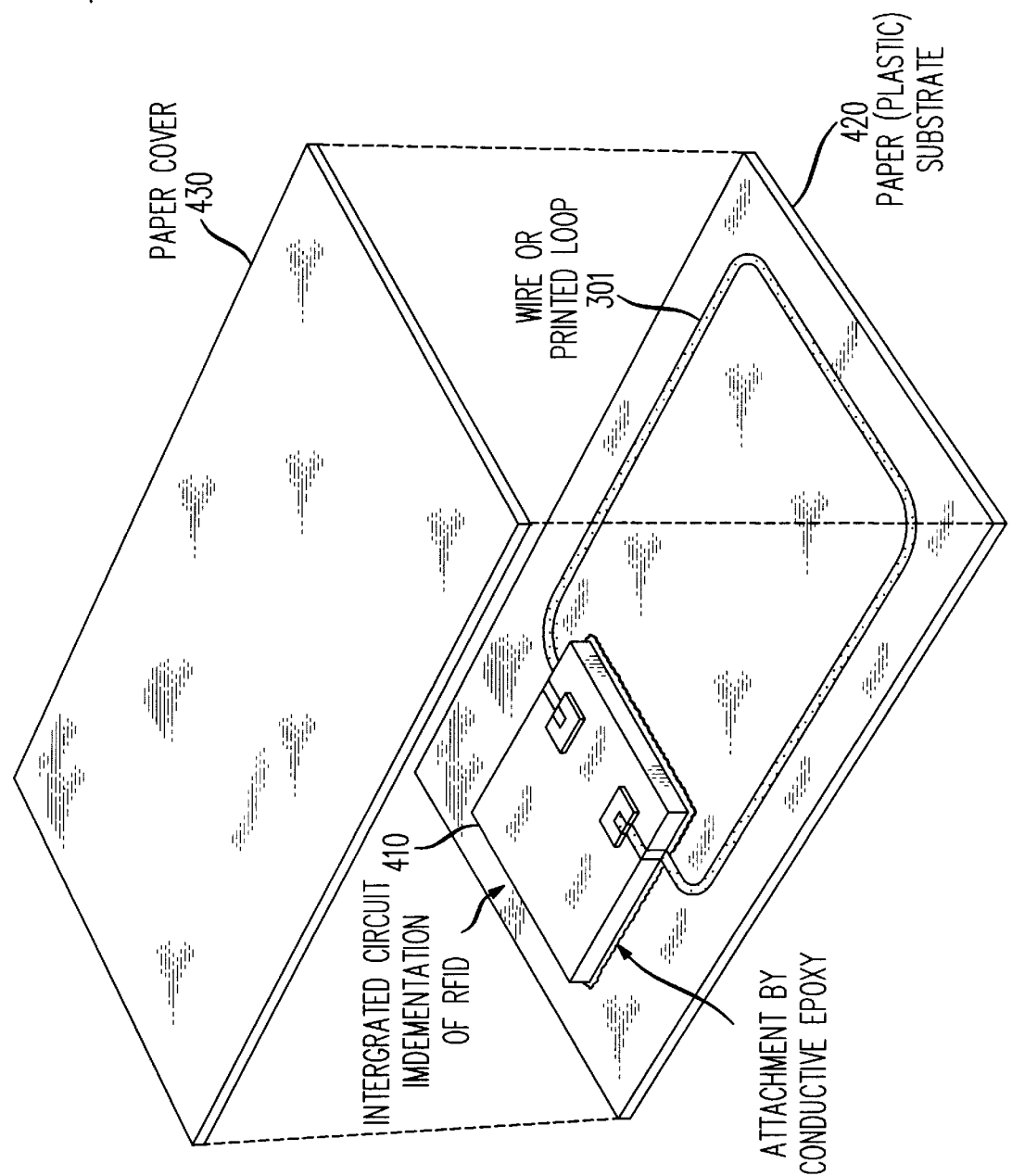
FIG. 4 shows a depiction of an integrated circuit and a loop antenna being respectively located in the tag unit, in accordance with the invention.

Referring now to FIG. 4, there is shown a depiction of the ASIC 410 and the antenna 301 as they are respectively positioned in the tag 105. Both the antenna 301 and the ASIC 410 include a pair of conducting pads formed for connecting the antenna to this ASIC. The antenna 301 is implemented as a loop antenna, which may be fabricated from a thin wire formed into a loop and tacked to an adhesive on the substrate 420, or alternatively, by printing a conductive ink onto this substrate, which may be either a paper or plastic substrate. If a paper substrate is employed, a plastic film may be affixed on one side to minimize moisture penetration. Yet another option for forming the antenna 301 is to print this antenna onto the substrate 420 with conductive ink. The ASIC 410 is placed in contact with the loop antenna using a conductive epoxy, and this assembly then cured. This assembly process in shown in FIG. 5.

The above described tag assembly may be manufactured on continuous rolls and provided to a point of sale terminal, where the baggage tags are issued. At the point of use, a top layer of paper 430 with an adhesive back is printed and applied to the prepared substrate 420. The advantage of this last minute assembly is that the ASIC 410 may have data programmed into it at the point of use by direct electrical contact between a programmer and the ASIC. This is a very secure method of programming since RF coupling is not involved. Also, identifying information is printed on the outer surface of the substrates in the form of, for example, bar codes and the like, in order to allow these tags to be readily readable in other forms, as well.

An alternative method of assembly for the tag is to apply the top paper 430 to the substrate assembly in the factory immediately after the ASIC 410 and the antenna 301 are attached. The ASIC can be located on the substrate 420 such that a small thickness change in the tag will not interfere with the printing operation. This assembly process in shown in FIG. 6

The tag is programmed with routing and passenger data at the point of check-in by writing to the tag with an intense RF signal which produces a programming voltage in the tag larger than would be possible after deployment on the luggage. Alternatively, the tags may be programmed at the point of issue by using probes which penetrate the tag to contact pads that were printed at the time of tag manufacture. In this implementation, the penetrating probes do not touch or damage the ASIC 410 or the antenna 301 in the tag.

Figure 5:
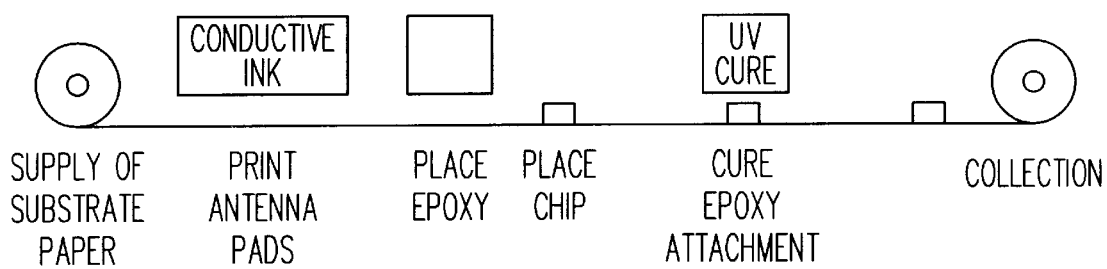
FIG. 5 shows a first assembly process for the tag, in accordance with the invention.
Figure 6:
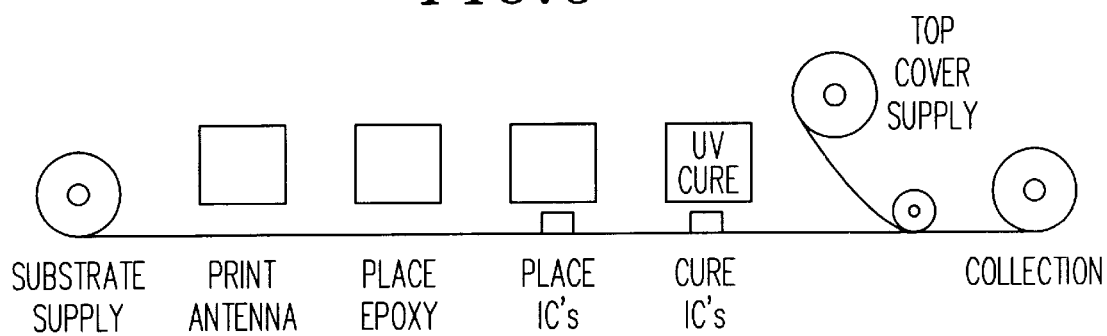
FIG. 6 shows, a second assembly process for the tag in accordance with the invention.

Both of the assembly operations described in FIGS. 5 and 6 may be performed in a batch process, or multiple components may be placed across the width of the substrate, so that several tags are simultaneously fabricated at each point along the length of the substrate material.

What has been described is merely illustrative of the application of the principles of the present invention. Other arrangements, substrate materials, antenna and IC implementations and methods may be employed by those skilled in the art without departing from the spirit and scope of the present invention.

We claim:

1. A method of assembly for a radio frequency identification tag having an integrated circuit and a loop antenna embedded in the tag, the method comprising the steps of:
    providing a supply of substrate material;
    forming an antenna on the substrate material, said antenna including a first pair of conducting pads;
    selectively applying a conductive epoxy onto the substrate material;
    positioning the integrated circuit on the substrate material so that a second pair of conducting pads on said integrated circuit are positioned in contact alignment with said first pair of conducting pads for said antenna; and
    curing the conducting epoxy for forming an attachment between the first pair of conducting pads on the antenna and the second pair of conducting pads on the integrated circuit.

2. The method of claim 1 wherein the antenna forming step includes the step of fabricating the loop antenna from a thin wire positioned on the substrate material.

3. The method of claim 1 wherein the antenna forming step includes the step of fabricating the loop antenna by printing a conductive ink onto the substrate material.

4. The method of claim 3 wherein the substrate material is paper.

5. The method of claim 3 wherein the substrate material is plastic.

6. The method of claim 1 further including the step of providing in said integrated circuit a radio function and a data function for communicating over said antenna.

7. The method of claim 6 further including the step of receiving operating power for said integrated circuit over said antenna.

8. A method of assembly for a radio frequency identification tag having an integrated circuit and a loop antenna embedded in the tag, the method comprising the steps of:
    providing a first supply of a first substrate material;
    forming an antenna on the first substrate material, said antenna including a first pair of conducting pads;
    selectively applying a conductive epoxy onto the first substrate material;
    positioning the integrated circuit on the first substrate material so that a second pair of conducting pads on said integrated circuit are positioned in contact alignment with said first pair of conducting pads for said antenna;
    curing the conducting epoxy for forming an attachment between the first pair of conducting pads on the antenna and the second pair of conducting pads on the integrated circuit; and
    providing a second supply of a second substrate material for encapsulating said antenna and said integrated circuit between said first substrate material and said second substrate material.

9. The method of claim 8 wherein the antenna forming step includes the step of fabricating the loop antenna from a thin wire positioned on the first substrate material.

10. The method of claim 8 wherein the antenna forming step includes the step of fabricating the loop antenna by printing a conductive ink onto the first substrate material.

11. The method of claim 8 wherein the first substrate material is paper and the second substrate material is paper.

12. The method of claim 8 wherein the first substrate material is plastic and the second substrate material is paper.

13. The method of claim 8 wherein the first substrate material is plastic and the second substrate material is plastic.

14. The method of claim 8 further including the step of embedding a power cell in said tag for providing operating power for said integrated circuit.

* * * * *